(12) United States Patent
Nagae et al.

(10) Patent No.: US 10,566,518 B2
(45) Date of Patent: Feb. 18, 2020

(54) COMPOSITE SUBSTRATE AND THICKNESS-TENDENCY ESTIMATING METHOD FOR PIEZOELECTRIC SUBSTRATE

(71) Applicant: NGK INSULATORS, LTD., Nagoya (JP)

(72) Inventors: Tomoki Nagae, Nagoya (JP); Ayato Koizumi, Seto (JP)

(73) Assignee: NGK Insulators, Ltd., Nagoya (JP)

( * ) Notice: Subject to any disclaimer, the term of this patent is extended or adjusted under 35 U.S.C. 154(b) by 382 days.

(21) Appl. No.: 15/443,023

(22) Filed: Feb. 27, 2017

(65) Prior Publication Data

US 2017/0170385 A1    Jun. 15, 2017

Related U.S. Application Data

(63) Continuation of application No. PCT/JP2016/077033, filed on Sep. 14, 2016.

(30) Foreign Application Priority Data

Sep. 15, 2015  (JP) ................................. 2015-181763

(51) Int. Cl.
*H01L 41/337* (2013.01)
*H01L 41/08* (2006.01)

(52) U.S. Cl.
CPC .......... *H01L 41/337* (2013.01); *H01L 41/081* (2013.01)

(58) Field of Classification Search
CPC combination set(s) only.
See application file for complete search history.

(56) References Cited

U.S. PATENT DOCUMENTS 9,368,713 B2 *   6/2016   Watanabe ............... H01L 41/18
2002/0027398 A1  3/2002   Ueda et al.
(Continued)

FOREIGN PATENT DOCUMENTS

JP   2001-110788 A   4/2001
JP   2002-079457 A   3/2002
(Continued)

OTHER PUBLICATIONS

English Translation of International Search Report, International Application No. PCT/JP2016/077033, dated Nov. 29, 2016 (2 pages).

(Continued)

*Primary Examiner* — Bryan P Gordon
(74) *Attorney, Agent, or Firm* — Burr & Brown, PLLC (57) ABSTRACT

A composite substrate according to the present invention includes a support substrate having a diameter of 2 inches or more, and a piezoelectric substrate having a thickness of 20 μm or less and bonded to the support substrate to transmit light. The piezoelectric substrate has a thickness distribution shaped like a fringe. A waveform having an amplitude within a range of 5 to 100 nm in a thickness direction and a pitch within a range of 0.5 to 20 mm in a width direction appears in the thickness distribution of the piezoelectric substrate in a cross section of the composite substrate taken along a line orthogonal to the fringe, and the pitch of the waveform correlates with a width of the fringe. In the piezoelectric substrate, the fringe may include either parallel fringes or spiral or concentric fringes.

6 Claims, 10 Drawing Sheets

(56) References Cited

U.S. PATENT DOCUMENTS

| | | | | |
|---|---|---|---|---|
| 2010/0156241 A1* | 6/2010 | Suzuki | ................ | H03H 9/0585 |
| | | | | 310/325 |
| 2010/0194246 A1* | 8/2010 | Wang | ................ | H03H 9/02047 |
| | | | | 310/365 |
| 2012/0161585 A1* | 6/2012 | Nakahara | .............. | H01L 41/313 |
| | | | | 310/348 |
| 2013/0249354 A1 | 9/2013 | Watanabe et al. | | |
| 2013/0285768 A1* | 10/2013 | Watanabe | ............ | H03H 9/0222 |
| | | | | 333/193 |
| 2015/0280107 A1* | 10/2015 | Hori | ........................ | H03H 3/08 |
| | | | | 310/313 R |

FOREIGN PATENT DOCUMENTS

| | | |
|---|---|---|
| JP | 2002-190629 A | 7/2002 |
| JP | 2012-185132 A | 9/2012 |
| JP | 2013-197553 A | 9/2013 |
| JP | 2015-050653 A | 3/2015 |
| WO | 2014/104098 A1 | 7/2014 |

OTHER PUBLICATIONS

International Search Report and Written Opinion (Application No. PCT/JP2016/077033) dated Nov. 29, 2016.

English translation of International Preliminary Report on Patentability (Chapter I) (Application No. PCT/JP2016/077033) dated Mar. 29, 2018, 6 pages.

\* cited by examiner

FIG. 2A

FIG. 2B ⬇ Step (a)

FIG. 2C ⬇ Step (b)

FIG. 2D ⬇ Step (c)

Y direction 40mm×3 0.2mm pitch measurement (X=-20,0,20 [mm])

FIG. 7A
Photographed image

FIG. 7B
High contrast image

FIG. 8

Measurement line

FIG. 9A
Before step (c)

FIG. 9B
After Step (c)

FIG. 10

FIG. 11A
Before step (c)

FIG. 11B
After Step (c)

FIG. 12

FIG. 13A
Photographed image

FIG. 13B
High contrast image

FIG. 14

| Type of fringe | Vertical fringes | Spiral fringes | Concentric fringes |
|---|---|---|---|
| Pattern |  |  |  |

COMPOSITE SUBSTRATE AND THICKNESS-TENDENCY ESTIMATING METHOD FOR PIEZOELECTRIC SUBSTRATE

BACKGROUND OF THE INVENTION

1. Field of the Invention

The present invention relates to a composite substrate and a thickness-tendency estimating method for a piezoelectric substrate.

2. Description of the Related Art

It is expected to realize an unconventional elastic wave device operable at a high frequency by using a piezoelectric thin film having a considerably small thickness. Preferably, the piezoelectric thin film is a piezoelectric single crystal thin film having high crystallinity, an arbitrary crystal axis, and uniform thickness. As a method for obtaining such a piezoelectric thin film, for example, PTL 1 proposes that a piezoelectric-substrate side of a laminated substrate having a diameter of 2 inches or more and obtained by bonding a piezoelectric substrate and a support substrate is mirror-polished, data on a thickness distribution of the polished piezoelectric substrate is created, and ion beam machining is performed on the basis of the data on the thickness distribution.

CITATION LIST

Patent Literature

PTL 1: WO 2014/104098

SUMMARY OF THE INVENTION

While the thickness of the piezoelectric substrate can be adjusted with relatively high precision by ion beam machining, it is difficult to visually estimate the overall tendency of the thickness of the piezoelectric substrate (hereinafter also referred to as a thickness tendency). For this reason, there has been a demand for a composite substrate that allows the thickness tendency of a piezoelectric substrate to be estimated visually.

The present invention has been made to solve such a problem, and a main object of the invention is to provide a composite substrate that allows a thickness tendency of a piezoelectric substrate to be estimated visually.

As a result of earnest study to solve the above problem, the present inventors found that the thickness tendency of a piezoelectric substrate on a support substrate could be visually estimated in a composite substrate in which the piezoelectric substrate is subjected to predetermined polishing, and achieved the present invention.

A composite substrate according to the present invention includes:

a support substrate having a diameter of 2 inches or more; and a piezoelectric substrate having a thickness of 20 μm or less and bonded to the support substrate to transmit light, wherein the piezoelectric substrate has a thickness distribution shaped like a fringe, and wherein a waveform having an amplitude of 5 nm or more and 100 nm or less in a thickness direction and a pitch of 0.5 mm or more and 20 mm or less in a width direction appears in the thickness distribution of the piezoelectric substrate in a cross section of the composite substrate taken along a line orthogonal to the fringe, and the pitch of the waveform correlates with a width of the fringe.

A thickness-tendency estimating method for a substrate according to the present invention that estimates a thickness tendency of a piezoelectric substrate in the above-described composite substrate and includes:

irradiating the piezoelectric substrate of the composite substrate with monochromatic light;

determining whether or not a second interference fringe different from a first interference fringe representing the fringe-shaped thickness distribution appears; and determining the thickness tendency of the piezoelectric substrate from a shape of an intersection of a bright line of the first interference fringe and a dark line of the second interference fringe when it is determined that the second interference fringe appears, on a basis that, when the bright line of the first interference fringe at the intersection is recessed, a thickness increases in a recessing direction, and when the bright line of the first interference fringe at the intersection projects, the thickness increases in a projecting direction, and determining that the thickness tendency is not found in the thickness of the piezoelectric substrate when it is determined that the second interference fringe does not appear.

The composite substrate and the thickness-tendency estimating method for the substrate according to the present invention enable visual estimation of the thickness tendency of the piezoelectric substrate on the support substrate. The reason for this is given as follows. In the composite substrate of the present invention, the piezoelectric substrate having a thickness of 20 μm or less and configured to transmit light is bonded to the support substrate. For this reason, when monochromatic light is applied, light reflected by a surface of the piezoelectric substrate and light reflected by a surface of the support substrate (a back surface of the piezoelectric substrate) interfere with each other. Since the piezoelectric substrate has a predetermined fringe-shaped thickness distribution, when the surface thereof is observed, according to the optical path difference (thickness of piezoelectric substrate×2) between the light reflected by the surface of the piezoelectric substrate and the light reflected by the surface of the support substrate, portions (bright lines) which look bright because both the lights intensify each other and portions (dark lines) which look dark because both the lights cancel out each other appear alternately (interference fringes). When the piezoelectric substrate has the thickness tendency, interference fringes representing the thickness tendency also appear. Here, it is known that, when the shapes of the intersections of the bright lines of the first interference fringes representing the fringe-shaped thickness distribution and the dark lines of the second interference fringes representing the thickness tendency of the piezoelectric substrate are observed, it is known that, in portions where the bright lines of the first interference fringes are recessed, the thickness increases in the recessing direction, and in portions where the bright lines of the first interference fringes project, the thickness increases in the projecting direction. For this reason, the thickness tendency of the piezoelectric substrate can be visually estimated from the shapes of the intersections of the interference fringes.

DETAILED DESCRIPTION OF THE INVENTION

Figure 1:
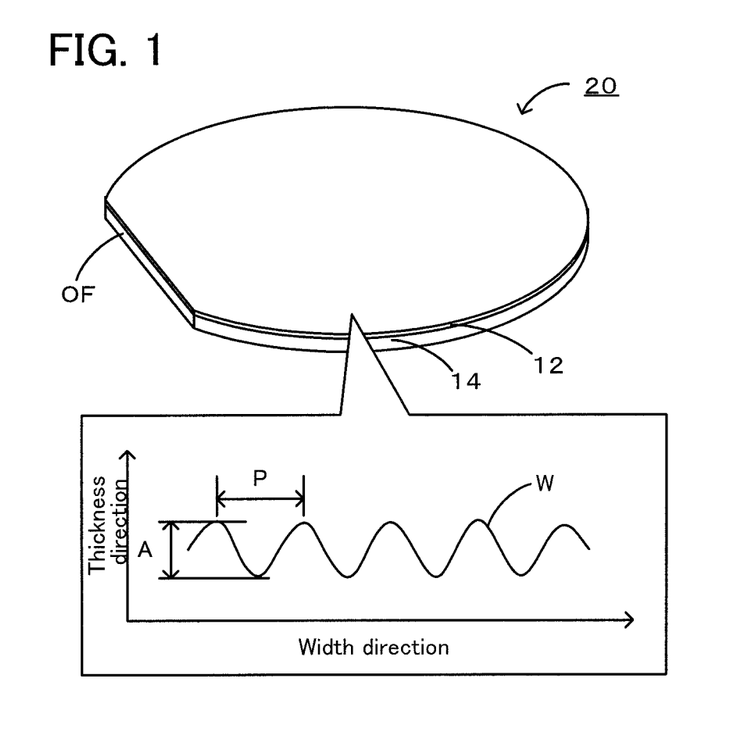
FIG. 1 is a perspective view of a composite substrate 20.

A composite substrate according to a preferred embodiment of the present invention will be described with reference to the drawings. FIG. 1 is a perspective view of a composite substrate 20 according to the embodiment.

The composite substrate 20 has a diameter of 2 inches or more and is formed by bonding a piezoelectric substrate 12 and a support substrate 14. The piezoelectric substrate 12 transmits light, and examples of the material of the piezoelectric substrate 12 include lithium tantalate, lithium niobate, a lithium niobate-lithium tantalate solid solution single crystal, lithium borate, langasite, and crystal. The size of the piezoelectric substrate 12 may be such that the diameter is 2 inches or more, preferably 4 inches or more, and more preferably 4 to 8 inches and the thickness is 20 μm or less, and preferably 0.2 to 15 μm. The difference between the largest thickness and the smallest thickness of the piezoelectric substrate 12 is preferably 100 nm or less, and more preferably 60 nm or less over the entire surface. Examples of the material of the support substrate 14 include silicon, sapphire, aluminum nitride, alumina, alkali-free glass, borosilicate glass, fused quartz, lithium tantalate, lithium niobate, a lithium niobate-lithium tantalate solid solution single crystal, lithium borate, langasite, and crystal. The size of the support substrate 14 may be such that the diameter is larger than or equal to that of the piezoelectric substrate 12 and the thickness is 100 to 1000 μm, and preferably 150 to 500 μm. While the composite substrate 20 may include an orientation flat (OF), as illustrated in FIG. 1, it may include no OF.

The composite substrate 20 is formed by combining the piezoelectric substrate 12 and the support substrate 14 by direct bonding or by bonding the piezoelectric substrate 12 and the support substrate 14 with an organic adhesive layer interposed therebetween. The material of the organic adhesive layer is, for example, epoxy resin or acrylic resin. Direct bonding may be performed by activating bonding surfaces of the piezoelectric substrate and the support substrate and then pressing the substrates with the bonding surfaces being opposed to each other. The bonding surfaces may be activated, for example, by being irradiated with an ion beam of an inert gas (such as argon) or being irradiated with plasma or a neutral atom beam. The composite substrate 20 is preferably formed by combining the piezoelectric substrate 12 and the support substrate 14 by direct bonding. When the piezoelectric substrate 12 and the support substrate 14 are combined by direct bonding, an organic adhesive layer is not provided therebetween, and a gap is rarely formed therebetween. Hence, there are few layers for forming the difference in optical path length, other than the piezoelectric substrate 12. For this reason, interference fringes are unlikely to be disturbed, and the shapes of intersections of the interference fringes is easily estimated.

Figure 14:
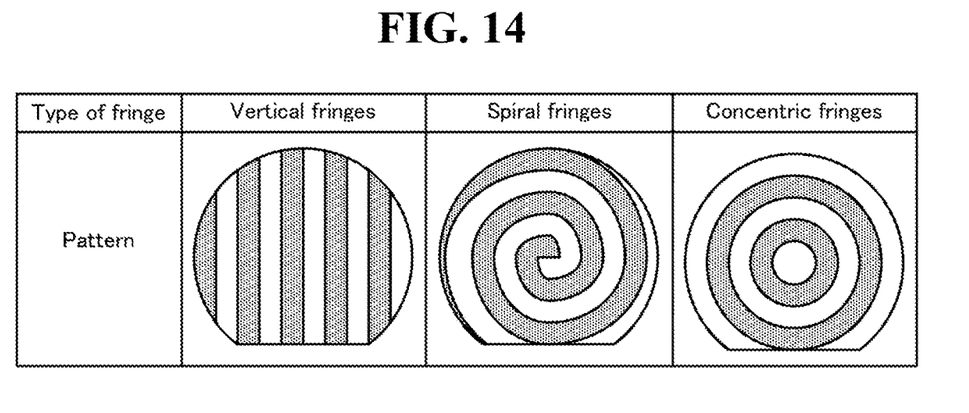
FIG. 14 shows examples of fringe-shaped thickness distributions.

The piezoelectric substrate 12 has a fringe-shaped thickness distribution. A waveform W having an amplitude A in the thickness direction and a pitch P in the width direction appears in the thickness distribution of the piezoelectric substrate 12 in a cross section of the composite substrate 20 taken along a line orthogonal to the fringes. The pitch P in the waveform W correlates with the width of the fringes in the fringe-shaped thickness distribution. FIG. 14 shows examples of fringe-shaped thickness distributions. In FIG. 14, a thin portion corresponding to a trough side of the waveform W is shown in gray, and a thick portion corresponding to a crest side of the waveform W is shown in white. The fringes in the fringe-shaped thickness distribution may be parallel fringes such as vertical fringes, horizontal fringes, or oblique fringes, spiral fringes, or concentric fringes.

The amplitude A is the thickness difference between the trough (bottom of a recessed portion) and the crest (top of a projecting portion) in the waveform W, and may be either a fixed value or a value that varies within a predetermined range. While it is only necessary that the amplitude A should be 5 nm or more and 100 nm or less, the amplitude A is preferably 5 nm or more and 50 nm or less, and more preferably 5 nm or more and 30 nm or less. When the amplitude A is 5 nm or more, the thickness tendency of the piezoelectric substrate 12 can be estimated from the interference fringes, as in a thickness-tendency estimating method for the piezoelectric substrate to be described later. When the amplitude A is 100 nm or less, variations in the thickness of the piezoelectric substrate are not too large, and the piezoelectric substrate can be suitably used (for example, in an elastic wave device). The pitch P is the distance between adjacent troughs (bottoms of recessed portions) or adjacent crests (tops of projecting portions) in the waveform W, and may be either a fixed value or a value that varies within a predetermined range. While it is only necessary that the pitch P should be 0.5 mm or more and 20 mm or less, the pitch P is 1 mm or more and 10 mm or less, and more preferably 1 mm or more and 5 mm or less. When the pitch P is 0.5 mm or more and 20 mm or less, the thickness tendency of the piezoelectric substrate 12 can be estimated from the interference fringes. The pitch P is preferably 0.5% or more and 20% or less of the outer diameter of the piezoelectric substrate 12, and more preferably 1% or more and 5% or less. When the pitch P is 0.5% or more and 20% or less, the shapes of intersections of the interference fringes is easily estimated. The amplitude A and the pitch P may either be fixed or be different among the waves. Further, a high-frequency component may be superimposed on the above-described waveform W. In this case, an amplitude A and a pitch P when the high-frequency component (for example, a component having a pitch of less than 0.5 mm) is removed may be used as the amplitude A and the pitch P of the waveform W.

Figure 3:
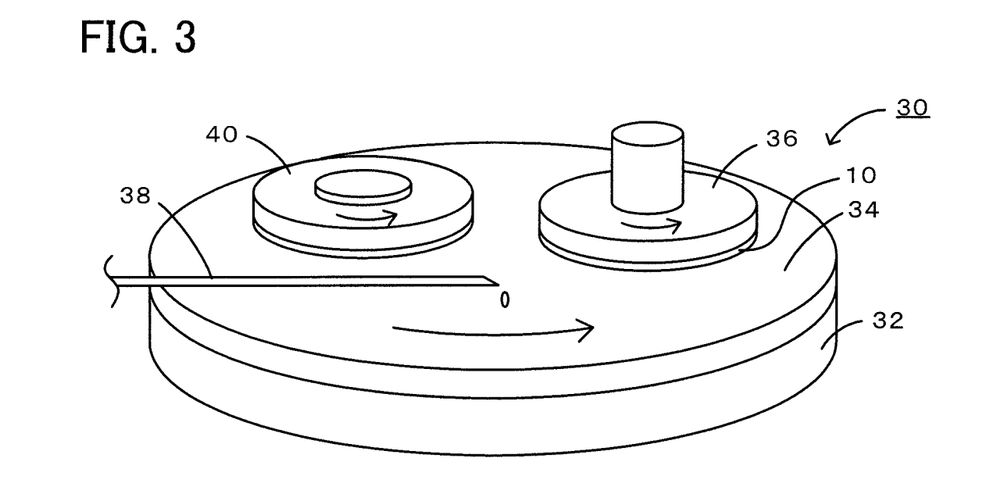
FIG. 3 is a perspective view of a polishing part in a typical CMP machine 30.
Figure 4:
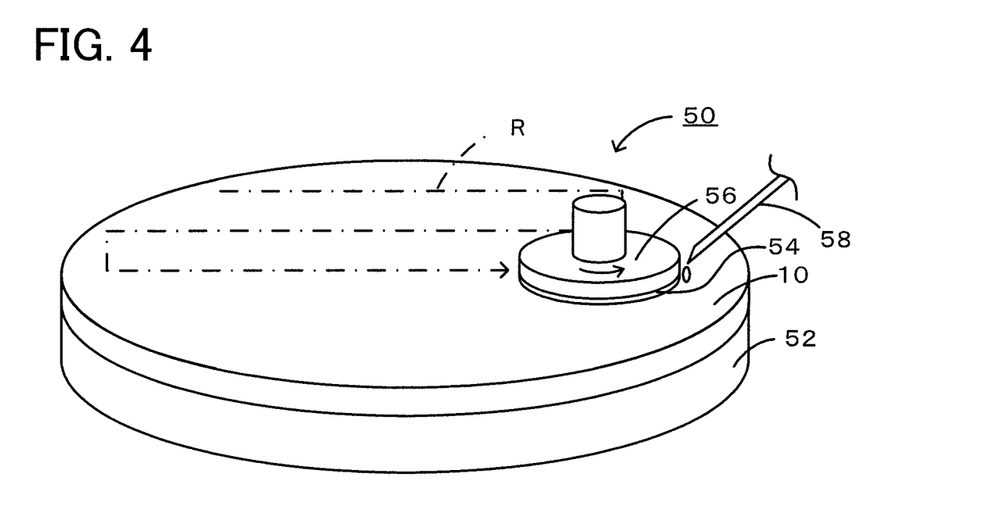
FIG. 4 is a perspective view of a polishing part in a small-diameter tool CMP machine 50.
Figure 5:
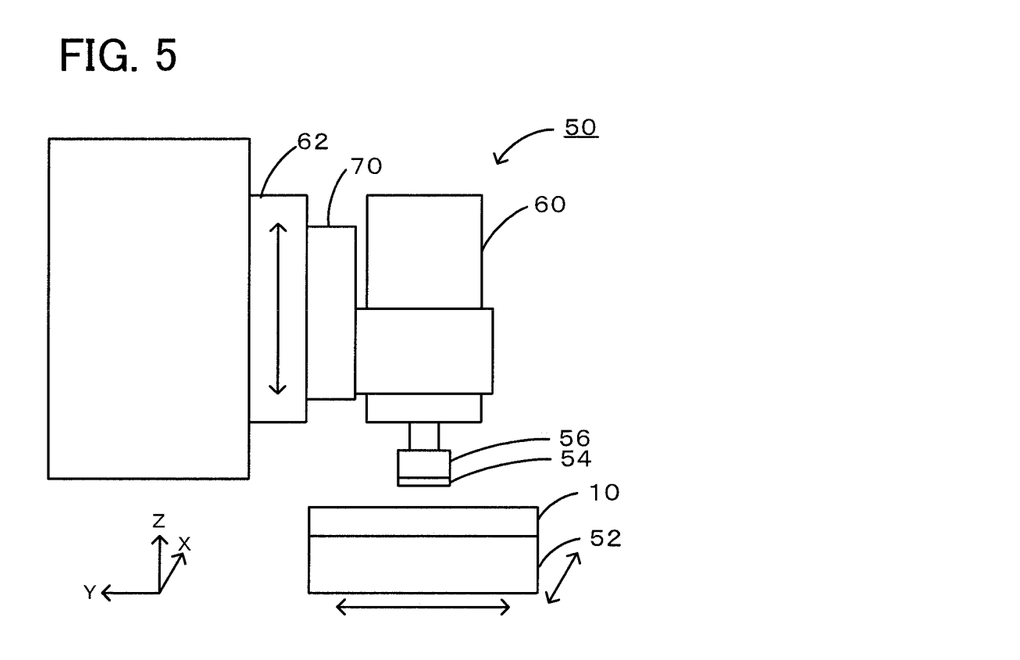
FIG. 5 is an explanatory view of the small-diameter tool CMP machine 50.

The composite substrate of the embodiment may be produced by a production method including the following Steps (a) to (c). FIGS. 2A to 2D are explanatory views of a production method for the composite substrate 20 of the embodiment. FIG. 3 is a perspective view of a polishing part in a typical CMP machine 30 used in, for example, Step (a). FIG. 4 is a perspective view of a polishing part in a small-diameter tool CMP machine 50 used in, for example, Step (c), and FIG. 5 is an explanatory view of the small-diameter tool CMP machine 50.

1. Step (a)

Figure 2A:
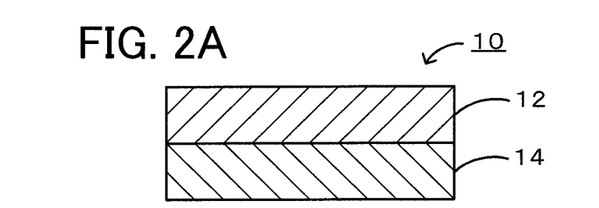
FIGS. 2A to 2D are explanatory views of a production method for the composite substrate 20.

First, a laminated substrate 10 having a diameter of 2 inches or more and formed by bonding a piezoelectric substrate 12 and a support substrate 14 is prepared (FIG. 2A). In the laminated substrate 10, the thickness of the piezoelectric substrate 12 may be 100 to 1000 µm, and preferably 150 to 500 µm.

Figure 2B:
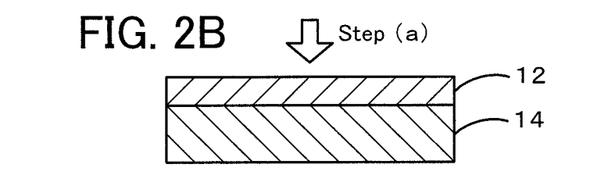

Next, a piezoelectric-substrate 12 side of the laminated substrate 10 having the diameter of 2 inches or more and formed by bonding the piezoelectric substrate 12 and the support substrate 14 is mirror-polished until the thickness of the piezoelectric substrate 12 reaches 20 µm or less, and preferably 1 to 15 µm (FIG. 2B). For example, the piezoelectric substrate 12 side of the laminated substrate 10 may be polished with a grinder, may be then polished with a lapping machine, and may further be mirror-polished with a CMP machine until the thickness of the piezoelectric substrate 12 reaches 20 µm or less. This can efficiently reduce the thickness of the piezoelectric substrate 12 to 20 µm or less. Here, the term CMP is an abbreviation of chemical mechanical polishing.

As the CMP machine, for example, a typical CMP machine 30 illustrated in FIG. 3 may be used. The CMP machine 30 includes a disc-shaped polishing platen 32 provided with a polishing pad 34 and having a large diameter, a disc-shaped substrate carrier 36 having a small diameter, a pipe 38 that supplies slurry containing abrasive grains to the polishing pad 34, and a conditioner 40 that conditions the polishing pad 34. The polishing platen 32 includes a shaft and a driving motor, which are not illustrated, in the center of a lower surface thereof, and axially rotates (rotates) along with rotational driving of the shaft by the driving motor. The substrate carrier 36 and the conditioner 40 have their respective shafts in the centers of upper surfaces thereof, and axially rotate (rotate) along with rotational driving of the shafts by unillustrated driving motors. The substrate carrier 36 is disposed at a position deviating from the center of the polishing platen 32. To polish the laminated substrate 10 with the CMP machine 30, the laminated substrate 10 is loaded on a lower surface of the substrate carrier 36 with its piezoelectric substrate 12 side facing downward, and the laminated substrate 10 is held between the polishing pad 34 of the polishing platen 32 and the substrate carrier 36. Then, slurry containing abrasive grains is supplied from the pipe 38 onto the polishing pad 34. Thus, the slurry is supplied between the laminated substrate 10 and the polishing pad 34 of the polishing platen 32. In this state, CMP is performed by rotating the polishing platen 32 and the substrate carrier 36 while pressing the laminated substrate 10 against the polishing pad 34 by the substrate carrier 36.

2. Step (b)

Figure 2C:
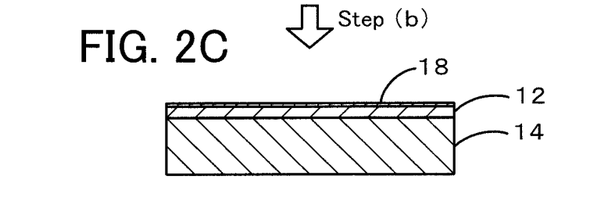
Figure 2D:
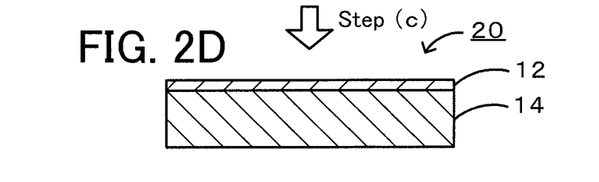

The surface of the piezoelectric substrate 12 is subjected to ion beam machining so that the difference between the largest thickness and the smallest thickness of the piezoelectric substrate 12 becomes 100 nm or less over the entire surface (FIG. 2C).

Data on a thickness distribution of the piezoelectric substrate 12 mirror-polished prior to ion beam machining may be created, and ion beam machining may be performed on the basis of the data on the thickness distribution of the mirror-polished piezoelectric substrate 12. The data on the thickness distribution of the mirror-polished piezoelectric substrate 12 may be created by measuring the thickness of the mirror-polished piezoelectric substrate 12 with an optical thickness meter using laser interferometry. This enables creation of accurate data on the thickness distribution. After that, the data on the thickness distribution of the mirror-polished piezoelectric substrate 12 may be input to an ion beam machine, the beam irradiation time at respective points on the surface of the piezoelectric substrate 12 may be determined, and machining may be performed using the beam irradiation time. This enables precise machining. In this case, the beam output value may be fixed, and the beam irradiation time may be increased as the above-described thickness increases. Alternatively, the data on the thickness distribution of the mirror-polished piezoelectric substrate 12 may be input to the ion beam machine, the beam output value at the respective points on the surface of the piezoelectric substrate 12 may be determined, and machining may be performed using the beam output value. This also enables precise machining. In this case, the beam irradiation time is fixed, and the beam output value is increased as the above-described thickness increases.

Ion beam machining is preferably performed using an ion beam machine equipped with a DC-excited Ar beam source. As the ion beam machine, an ion beam machine equipped with a plasma-excited Ar beam source may be used, but the ion beam machine equipped with the DC-excited Ar beam source is preferably used because an altered layer 18 formed on the surface of the piezoelectric substrate 12 is further reduced.

After ion beam machining, in the laminated substrate 10, for example, the thickness of the piezoelectric substrate 12 may be 20 µm or less, the difference between the largest thickness and the smallest thickness of the piezoelectric substrate 12 may be 100 nm or less over the entire surface, and the piezoelectric substrate 12 may have such crystallinity that the full width at a half maximum of a rocking curve obtained by X-ray diffraction is 100 arcsec or less. Such a laminated substrate 10 includes a piezoelectric single-crystal thin film (piezoelectric substrate 12) having high crystallinity, an arbitrary crystal axis, and a uniform thickness, and can be suitably used in, for example, an elastic wave device after Step (c).

3. Step (c)

A polishing pad having a diameter 5 mm or more and 30 mm or less is used, and CMP is performed by rotating and moving the polishing pad relative to the piezoelectric substrate 12 to be polished while maintaining a constant pressing force of the polishing pad (hereinafter also referred to as small-diameter tool CMP). In such small-diameter tool CMP, since the diameter of the polishing pad is sufficiently smaller than that of the piezoelectric substrate 12, when the polishing pad is moved relative to the piezoelectric substrate 12 while being rotated, a fringe-shaped thickness distribution is formed in the piezoelectric substrate 12. Also, since the polishing pad having the diameter 5 mm or more and 30 mm or less is used, polishing can be efficiently performed in a manner such that a waveform W having a pitch P within the range of 0.5 to 20 mm in the width direction appears in the thickness distribution of the piezoelectric substrate 12 in a cross section of the composite substrate 20 taken along a line orthogonal to the fringes. Further, since CMP is performed while maintaining a constant pressing force of the polishing pad, the thickness can be controlled with high precision, and the amplitude A of the waveform W in the thickness direction is easily controlled to the range of 5 nm or more and 100 nm or less.

In the small-diameter tool CMP, for example, the amplitude A can be adjusted to a desired value by controlling at least one of the pressing force, the rotation speed of the polishing pad, the moving speed of the polishing pad, the slurry concentration, and the slurry pH value. For example, the pressing force is preferably 5 kPa or more and 200 kPa or less, and more preferably 20 kPa or more and 100 kPa or less. For example, the rotation speed of the polishing pad is preferably 50 rpm or more and 20000 rpm or less, and more preferably 2000 rpm or more and 6000 rpm or less. In the small-diameter tool CMP, the pitch P can be adjusted to a desired value, for example, by adjusting the size of the polishing pad or adjusting the route of the polishing pad on the piezoelectric substrate 12. While it is only necessary that the diameter of the polishing pad should be 5 mm or more and 30 mm or less, the diameter is preferably 5 mm or more and 25 mm or less, and more preferably 10 mm or more and 20 mm or less. Alternatively, the size of the polishing pad is preferably 5% or more and 30% or less of the outer diameter of the piezoelectric substrate 12, and more preferably 10% or more and 20% or less. The route of the polishing pad on the piezoelectric substrate 12 may have, for example, a zigzag shape or a spiral shape. When polishing is performed along the zigzag route, parallel fringes can be formed in the fringe-shaped thickness distribution. When polishing is performed along the spiral route, spiral fringes can be formed in the fringe-shaped thickness distribution. In the route of the polishing pad on the piezoelectric substrate 12, the distance between adjacent route parts (trajectories of the center of the polishing pad) is preferably within the range of 5% to 50% of the outer diameter of the polishing pad, and more preferably within the range of 10% to 30%. The distance between the adjacent route parts is preferably 0.5 mm or more and 20 mm or less, and more preferably 1 mm or more and 10 mm or less.

In the small-diameter tool CMP, the polishing pad may be moved relative to the piezoelectric substrate 12 in such a tendency that the retention time in an outer peripheral portion (when the center of the polishing pad is located in the outer peripheral portion) is shorter than in an inner peripheral portion. In the outer peripheral portion, stress is likely to concentrate when the outer peripheral portion is in contact with the polishing pad, and the polishing amount per unit time is greater than in the inner peripheral portion. Hence, sagging resulting due to polishing is likely to occur. However, for example, sagging due to polishing is suppressed by making the retention time of the polishing pad in the outer peripheral portion shorter than in the inner peripheral portion. Further, the polishing pad may be moved relative to the piezoelectric substrate 12 in such a tendency that the retention time decreases as the thickness of the piezoelectric substrate 12 decreases. This can make the thickness of the piezoelectric substrate 12 more uniform. Alternatively, the polishing pad may be moved relative to the piezoelectric substrate 12 in such a tendency that the retention time in the outer peripheral portion is shorter than in the inner peripheral portion and the retention time decreases as the thickness of the piezoelectric substrate 12 decreases. This can suppress sagging, and can make the thickness of the piezoelectric substrate 12 more uniform. A range corresponding to 60% to 100% of the outer diameter of the piezoelectric substrate 12 (preferably 80% to 100%) may be referred to as an outer peripheral portion, and a range on an inner side of the outer peripheral portion may be referred to as an inner peripheral portion. Alternatively, a range within 20 mm from the outermost periphery of the piezoelectric substrate 12 (preferably 10 mm from the outermost periphery) may be referred to as an outer peripheral portion, and a range on an inner side of the outer peripheral portion may be referred to as an inner peripheral portion. For example, the retention time in the outer peripheral portion is preferably 20% to 95%, and more preferably 40% to 95% of the retention time in the inner peripheral portion.

As the apparatus used for the small-diameter tool CMP, for example, a small-diameter tool CMP machine 50 illustrated in FIGS. 4 and 5 may be used. The small-diameter tool CMP machine 50 includes a disc-shaped head 56 having a small diameter and provided with a polishing pad 54, a disc-shaped stage 52 having a large diameter, and a pipe 58 that supplies slurry containing abrasive grains to the polishing pad 54. The stage 52 includes an unillustrated driving part, and moves in the horizontal plane (X-axis and Y-axis directions). The head 56 has a shaft in the center of an upper surface thereof, and axially rotates (rotates) along with rotational driving of the shaft by an unillustrated driving motor. The shaft of the head 56 is attached to a support 60 fixed to a driving part 62 movable in the vertical direction with an unillustrated fixing part being interposed therebetween, and moves in the vertical direction (Z-axis direction). The driving part 62, the driving part of the stage 52, the driving part of the head 56, and so on are connected to an unillustrated control unit, and are controlled to rotate and move the polishing pad 54 relative to the piezoelectric substrate 12 to be polished while maintaining a constant pressing force of the polishing pad 54.

To polish the laminated substrate 10 with the small-diameter tool CMP machine 50, the laminated substrate 10 is loaded on an upper surface of the stage 52 with a piezoelectric substrate 12 side facing upward, and the laminated substrate 10 is held between the stage 52 and the polishing pad 54. Then, slurry containing abrasive grains is supplied from the pipe 58 to the polishing pad 54. Thus, the slurry is supplied between the laminated substrate 10 and the polishing pad 54. The polishing pad 54 is moved relative to the piezoelectric substrate 12 by moving the stage 52 in the horizontal direction in this state, and the pressing force of the polishing pad 54 is kept constant by controlling the upward and downward movements of the driving part 62. The laminated substrate 10 is subjected to CMP while rotating the polishing pad 54. At this time, for example, the polishing pad 54 and the piezoelectric substrate 12 may be moved relative to each other so that the center of the polishing pad 54 moves on the piezoelectric substrate 12 in a zigzag form (see a route R in FIG. 4) or moves in a spiral form.

During polishing with the small-diameter tool CMP machine 50, the pressing force applied to the polishing pad 54 is measured with a load measuring unit 70 (for example, a load cell or a dynamometer) disposed between the support 60 and the driving part 62, and the measured value is input to the above-described control unit. The control unit controls upward and downward movements of the driving part 62 on the basis of the input measured value. In this way, the pressing force of the polishing pad 54 can be kept constant. While the polishing pad 54 is moved relative to the piezoelectric substrate 12 by movement of the piezoelectric substrate 12 in the small-diameter tool CMP machine 50, it may be moved relative to the piezoelectric substrate 12 by movement of the polishing pad 54. Further, while the polishing pad 54 moves in the vertical direction, the piezoelectric substrate 12 may move in the vertical direction.

In the small-diameter tool CMP, CMP may be performed so that the thickness of the piezoelectric substrate 12 is 20 μm or less, and preferably 0.1 μm or more and 10 μm or less and the difference between the largest thickness and the smallest thickness is 100 nm or less, and preferably 50 nm or less over the entire surface.

The composite substrate of the present invention can be used, for example, as an elastic wave device by forming an electrode pattern on the surface of the piezoelectric substrate.

Next, a description will be given of a thickness-tendency estimating method for a piezoelectric substrate according to the preferred embodiment of the present invention. In this estimating method, first, the above-described composite substrate 20 is irradiated with monochromatic light. It is only necessary that the monochromatic light with which the composite substrate 20 is irradiated should be visible light, and for example, the monochromatic light may have either a wavelength within the range of 600 to 650 nm or a wavelength within the range of 380 to 750 nm. The monochromatic light is preferably vertically applied to the entire surface of the composite substrate 20. The monochromatic light may include light components having different wavelengths as long as they do not obscure the shapes of intersections of interference fringes.

Next, it is determined whether or not second interference fringes different from first interference fringes resulting from the fringe-shaped thickness distribution appear. For example, it may be determined whether or not interference fringes intersecting the first interference fringes appear. At this time, the OF of the piezoelectric substrate 12 may be used as the reference, and the first interference fringes and the second interference fringes may be distinguished by the positions or angles relative to the OF. In determination, the surface of the piezoelectric substrate may be visually checked directly or through a lens, or a taken image of the surface of the piezoelectric substrate may be used. However, visual checking is easier, and the interference fringes are more clearly seen. When the taken image is used, bright lines and dark lines may be distinguished by increasing the contrast of the image or binarizing the image. The bright lines and the dark lines can be distinguished by the relative difference in brightness therebetween.

When it is determined that the second interference fringes appear, the thickness tendency of the piezoelectric substrate is determined from the shapes of intersections of bright lines of the first interference fringes and dark lines of the second interference fringes on the basis that, when the bright lines of the first interference fringes at the intersections are recessed, the thickness increases in the recessing direction and that, when the bright lines of the first interference fringes at the intersections project, the thickness decreases in the projecting direction. In determination, the surface of the piezoelectric substrate may be visually checked directly or through a lens, or a taken image of the surface of the piezoelectric substrate may be used. When the taken image is used, bright lines and dark lines may be distinguished by binarizing the image. At this time, determination may be made for the shapes of intersections of all interference fringes. However, determination may be made for the shape of at least one intersection on each side surface of each of the dark lines in the second interference fringes, and determination for other intersections may be omitted. In one dark line, the thickness in the direction along the line is substantially constant. Hence, the thickness tendency of the piezoelectric substrate can be estimated without making determination for the shapes of all intersections.

When it is determined that the second interference fringes do not appear, it is determined that a tendency is not found in the thickness of the piezoelectric substrate.

In this way, the thickness tendency of the piezoelectric substrate is estimated. In the composite substrate 20 in which the fringes in the fringe-shaped thickness distribution are parallel fringes, the shapes of the intersections are easily checked, for example, when the thickness tendency of the piezoelectric substrate 12 draws concentric contours or when the thickness tendency of the piezoelectric substrate 12 draws horizontal contours intersecting the fringes in the fringe-shaped thickness distribution at a predetermined angle (for example, 30° to 90°, preferably 60° to 90°). In the composite substrate 20 in which the fringes in the fringe-shaped thickness distribution are spiral fringes or concentric fringes, the shapes of the intersections are easily checked, for example, when the thickness tendency of the piezoelectric substrate 12 draws horizontal contours.

Figure 15:
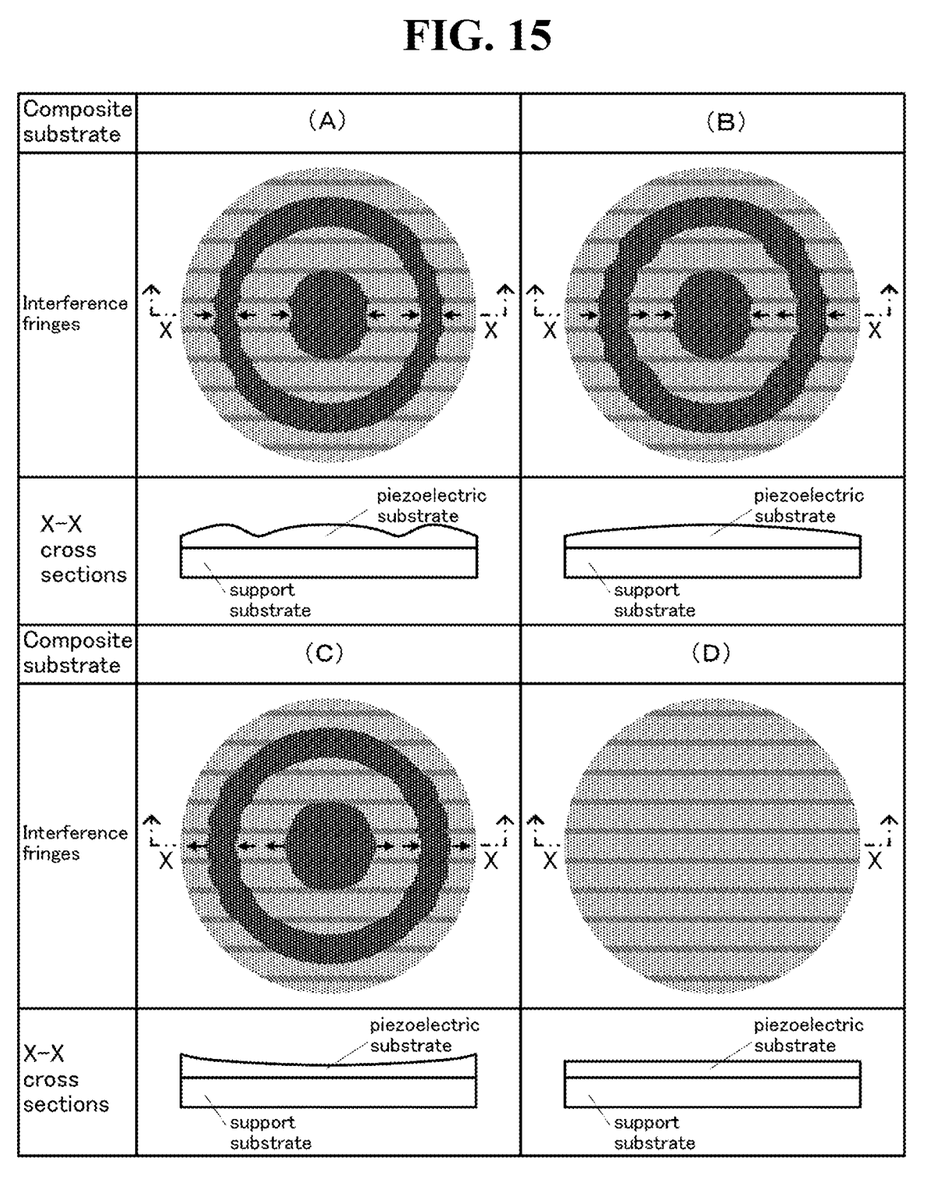
FIG. 15 shows examples of interference fringes observed when the composite substrate includes a piezoelectric substrate having a horizontally-striped thickness distribution as a fringe-shaped thickness and X-X cross sections of the composite substrate.

Hereinafter, the thickness-tendency estimating method for the substrate according to the embodiment will be described using specific examples. FIG. 15 shows examples of interference fringes observed when the composite substrate includes a piezoelectric substrate having a horizontally-striped thickness distribution as a fringe-shaped thickness distribution and X-X cross sections corresponding to the examples. In composite substrates of (A) to (C), concentric second interference fringes appear besides first interference fringes representing a horizontally-striped thickness distribution. Since the second interference fringes appear, the shapes of intersections of bright lines of the (horizontally-striped) first interference fringes and dark lines of the (concentric) second interference fringes are checked. It is determined that, when the horizontally-striped bright lines are recessed at the intersections, the thickness increases in the recessing direction and that, when the horizontal-shaped bright lines at the intersections project, the thickness increases in the projecting direction. In the drawings of the second interference fringes shown in FIG. 15, arrows show the directions judged as the thickness increasing directions. In this way, the thickness tendencies in the X-X cross sections can be estimated to be the illustrated tendencies. Since the concentric interference fringes centered on the center of the substrate appear as the second interference fringes in the composite substrates of (A) to (C), it can be estimated that the thickness tendency is similar to that in the X-X cross section even in cross sections other than the X-X cross section as long as the cross sections pass through the center of the substrate. In contrast, since only first interference fringes representing the horizontally-striped thickness distribution appear in (D), it is determined that second interference fringes do not appear. Since it is determined in (D) that the second interference fringes do not appear, determination is made on the basis that a tendency is not found in the thickness of the piezoelectric substrate. In this way, the thickness tendency in the X-X cross section can be estimated to be the illustrated tendency.

Figure 16:
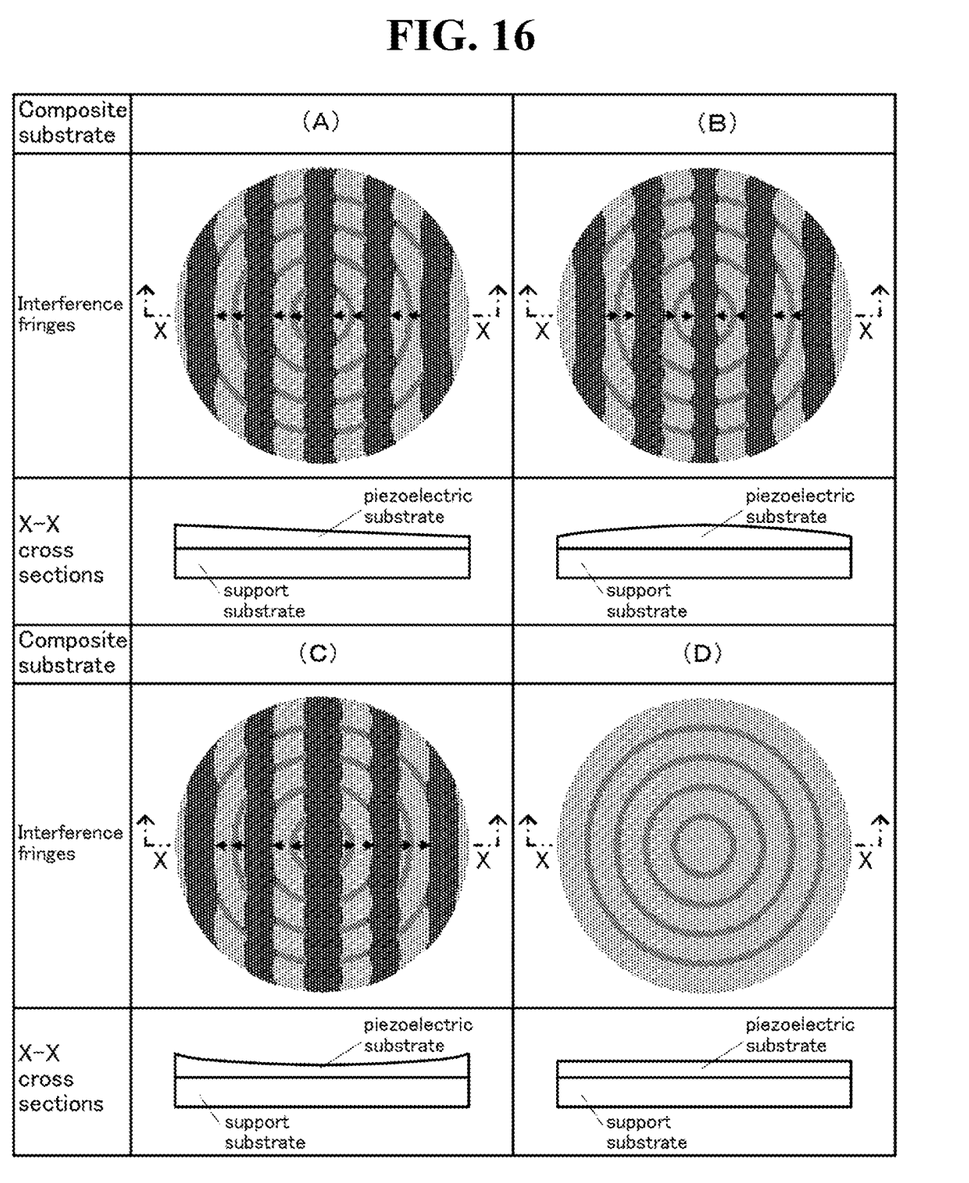
FIG. 16 shows examples of interference fringes observed when the composite substrate includes a piezoelectric substrate having a concentric thickness distribution as a fringe-shaped thickness distribution and X-X cross sections of the composite substrate.

FIG. 16 shows examples of interference fringes observed when the composite substrate includes a piezoelectric substrate having a concentric thickness distribution as a fringe-shaped thickness distribution, and X-X cross sections corresponding to the examples. In composite substrates of (A) to (C), vertically-striped second interference fringes appear besides first interference fringes representing the concentric thickness distribution. Since the second interference fringes appear, the shapes of intersections of bright lines of the (concentric) first interference fringes and dark lines of the (vertically-striped) second interference fringes are checked. It is determined that, when the concentric bright lines are recessed at the intersections, the thickness increases in the recessing direction and that, when the concentric bright lines at the intersections project, the thickness increases in the projecting direction. In the interference fringes in FIG. 16, arrows show the directions judged as the thickness increasing directions. In this way, the thickness tendencies in the X-X cross sections can be estimated to be the illustrated tendencies. Since the vertically-striped interference fringes appear as the second interference fringes in the composite substrates of (A) to (C), it can be estimated that the thickness tendency is similar to that in the X-X cross section even in cross sections other than the X-X cross section as long as the cross sections are parallel to the X-X cross section. In contrast, since only first interference fringes representing the concentric thickness distribution appear in (D), it is determined that second interference fringes do not appear. Since it is determined in (D) that the second interference fringes do not appear, determination is made on the basis that a tendency is not found in the thickness of the piezoelectric substrate. In this way, the thickness tendency in the X-X cross section can be estimated to be the illustrated tendency.

According to the composite substrate and the thickness-tendency estimating method for the substrate of the embodiment described above, the thickness tendency of the piezoelectric substrate can be estimated by visual check.

It is needless to say that the present invention is not limited to the above-described embodiment, but can be carried out in various embodiments as long as they belong to the technical scope of the invention.

For example, while the above-described production method for the composite substrate includes Steps (a) to (c), Step (a) and Step (b) may be omitted. Since Step (b) enables precise machining, it is preferable to perform Step (c) after Step (b) because this can make the thickness change of the piezoelectric substrate closer to a desired one. Further, since Step (a) enables high-speed machining (the thickness of the piezoelectric substrate can be made small), it is preferable to perform Step (b) and Step (c) after the thickness of the piezoelectric substrate is reduced to a predetermined value or less in Step (a), because this enhances machining efficiency.

For example, in the above-described production method for the composite substrate, Step (b) performs ion beam machining so that the difference between the largest thickness and the smallest thickness of the piezoelectric substrate 12 is 100 nm or less over the entire surface. However, the thickness of the outer peripheral portion may be thick beyond this difference. For example, Step (b) may be replaced with a step of performing ion beam machining so that the thickness of the outer peripheral portion of the piezoelectric substrate 12 is greater than the thickness of the inner peripheral portion and the difference between the largest thickness and the smallest thickness of the inner peripheral portion of the piezoelectric substrate 12 is 100 nm or less over the entire surface. Thus, sagging due to polishing rarely occurs in Step (c). In this case, the average value (or the center value) of the thickness of the outer peripheral portion 16 is preferably greater by 10 to 50 nm than the average value (or the center value) of the thickness of the inner peripheral portion.

In Step (b), data on a thickness difference distribution may be created by using the data on the thickness distribution of the mirror-polished piezoelectric substrate 12 and the data on the thickness distribution of the piezoelectric substrate 12 desired after ion beam machining, and ion beam machining may be performed on the basis of the data on the thickness difference distribution.

EXAMPLES

Cases in which the composite substrate according to the present invention was specifically produced will be described below as examples. The present invention is not limited to the following examples.

Example 1

A silicon substrate (support substrate) and a $LiNbO_3$ substrate (piezoelectric substrate), each of which was polished on both surfaces and had a thickness of 230 μm and a diameter of 4 inches, were prepared. These substrates were introduced into a vacuum chamber maintaining a vacuum degree on the order of $10^{-6}$ Pa, and were held with their bonding surfaces being opposed to each other. The bonding surfaces of the substrates were irradiated with an Ar beam for 80 seconds to remove inactive layers and to activate the surfaces. Next, the substrates were set in contact with each other, and were bonded together under a load of 1200 kgf. After a laminated substrate thus obtained was taken out, a piezoelectric-substrate side thereof was ground with a grinder until the thickness of the piezoelectric substrate reached 10 μm. Next, the laminated substrate was set on a lapping machine, and was polished through the use of a diamond slurry until the thickness of the piezoelectric thickness reached 3 μm. Further, the surface of the piezoelectric substrate was mirror-polished with a CMP machine until the thickness reached 0.8 μm. At this time, colloidal silica was used as the abrasive (Step (a)).

The thickness of the piezoelectric substrate was measured with an optical thickness meter using laser interferometry. As a result, the thickness fell within the range of 0.8 μm±0.1 μm over the entire surface of the piezoelectric substrate including the outer peripheral portion. The measurement was made at a total of 80 points over the entire surface of the piezoelectric substrate except for chamfered edges.

The laminated substrate thus obtained was set on an ion beam machine equipped with a plasma-excited Ar beam source. Next, data on a thickness distribution of the mirror-polished piezoelectric substrate measured with the above-described optical thickness meter and data on a thickness distribution desired after ion beam machining (the thickness of the outer peripheral portion was greater than that of the inner peripheral portion) were imported into the ion beam machine to create data on a thickness difference distribution. By using the data on the thickness difference distribution, the machining amounts at the respective measurement points in the piezoelectric substrate, here, the lengths of the irradiation time with the Ar beam were determined. The beam irradiation time was adjusted by the feeding speed of the laminated substrate. While changing the feeding speed of the laminated substrate, the entire surface of the piezoelectric surface was irradiated with the Ar beam at a constant output. The beam spot was 6 mm in diameter. Under fixed conditions where the ion accelerating voltage was 1300 eV and the ion current was 30 mA, RF plasma was excited. The actual machining time was about 5 minutes (Step (b)).

The thickness of the piezoelectric substrate in the machined laminated substrate was measured again. As a result, the center thickness was 450 nm, and the difference between the largest thickness and the smallest thickness was 65 nm over the entire surface including the outer peripheral portion. When a rocking curve was measured with an X-ray diffractometer, the full width at a half maximum (FWHM) thereof was 80 arcsec, and this was equal to that of the bulk single crystal.

The laminated substrate thus obtained was set in the small-diameter tool CMP machine 50 illustrated in FIGS. 4 and 5. Next, data on the thickness distribution of the piezoelectric substrate, which was subjected to ion beam machining, measured with the above-described optical thickness meter was imported to the small-diameter tool CMP machine 50, and the retention time of the polishing pad 54 was determined. Then, small-diameter tool CMP was performed by operating the small-diameter tool CMP machine 50 using this retention time. In the small-diameter tool CMP, the pad diameter of the polishing pad was 30 mm, the route of the polishing pad had a zigzag shape with an interval of 3 to 5 mm, and the rotation speed of the polishing pad was 4000 rpm (Step (c)).

Figure 6:
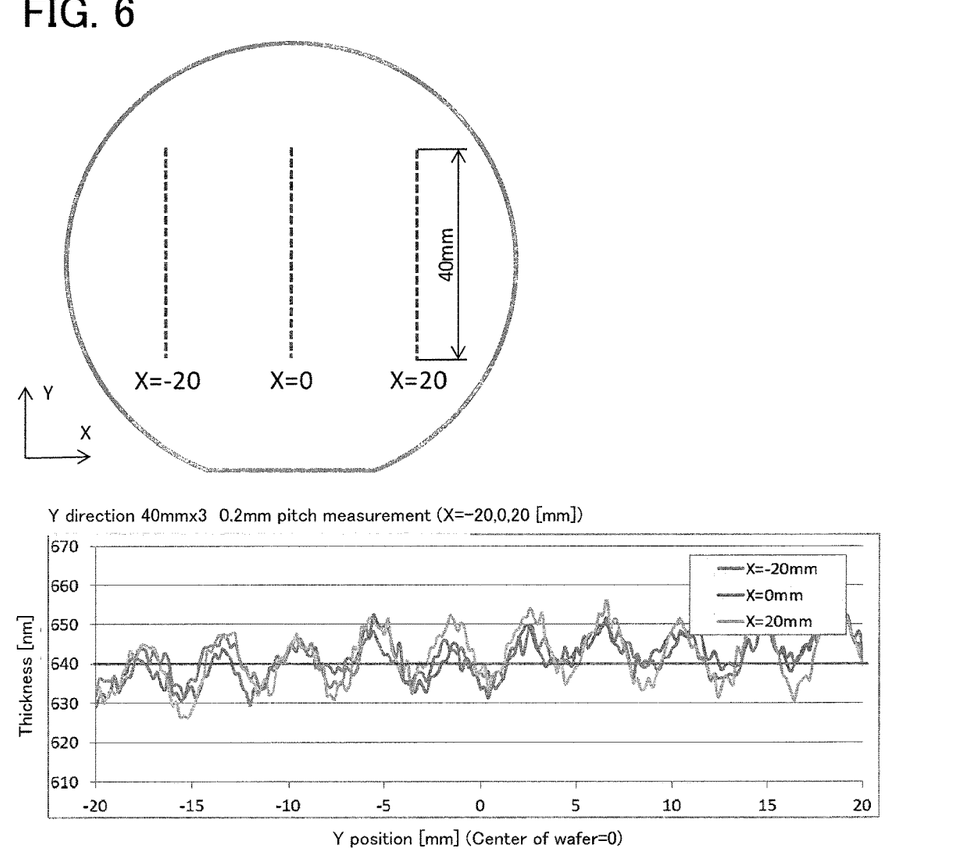
FIG. 6 shows measurement results of the thickness of the composite substrate according to Example 1.

The thickness of the composite substrate according to Example 1 (a fringe-shaped thickness distribution) was measured. The measurement result was shown in FIG. 6. FIG. 6 shows waveforms of thickness distributions in cross sections taken along a line passing through the center of the composite substrate, extending perpendicularly to the OF, and having a length of 40 mm (X=0) and lines having a length of 40 mm and extending parallel to and 20 mm apart from the above line on the left and right sides (X=−20, 20). As shown in FIG. 6, in the composite substrate of Example 1, waveforms having an amplitude of 5 to 20 nm in the thickness direction and a pitch of 3 to 5 mm in the width direction appeared in the thickness distributions of the piezoelectric substrate.

Figure 7A:
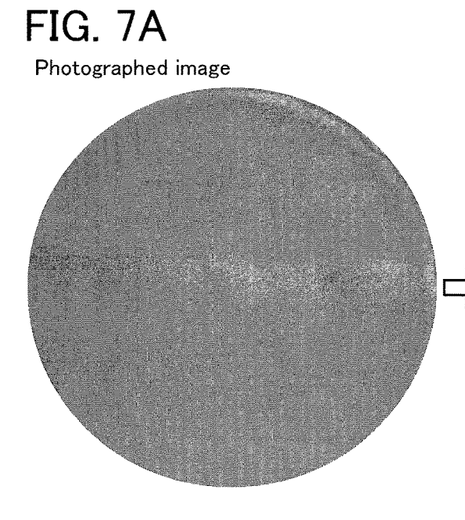
FIGS. 7A and 7B show interference fringes in the composite substrate of Example 1.
Figure 7B:
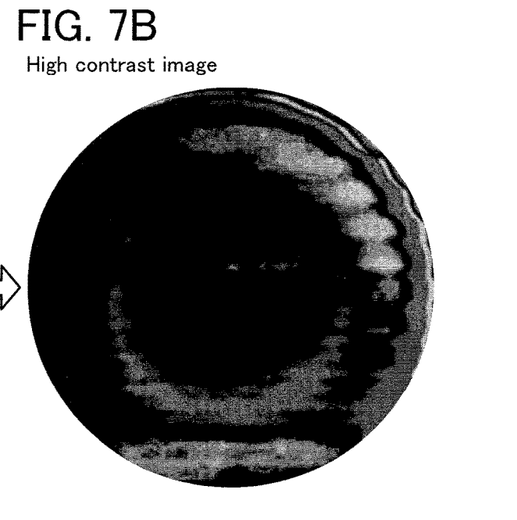

When the piezoelectric substrate in the composite substrate of Example 1 was irradiated with monochromatic light having a wavelength of 632.8 nm, horizontally-striped first interference fringes representing the thickness distribution and concentric second interference fringes were found. FIG. 7A shows a taken image of the interference fringes, and FIG. 7B shows an image with an increased contrast. In an upper right portion of FIG. 7B, bright lines (white portions) of the first interference fringes (horizontal stripes) at intersections of the interference fringes project to the right and left sides. This shows that portions toward which the bright lines project, that is, black portions are thick and white portions are thin. Here, while the white portions can be found only in a part of FIG. 7B, since the concentric second interference fringes are found, as shown in FIG. 7A, it is known that the portions concentric with the white portions in FIG. 7B are thinner than the other portions. From the above, it was guessed that the thickness tendency of the piezoelectric substrate of Example 1 drew concentric contours and had three projecting portions in the cross-section passing through the center of the substrate. Visually, the first and second interference fringes were confirmed more clearly than in FIGS. 7A and 7B.

Figure 8:
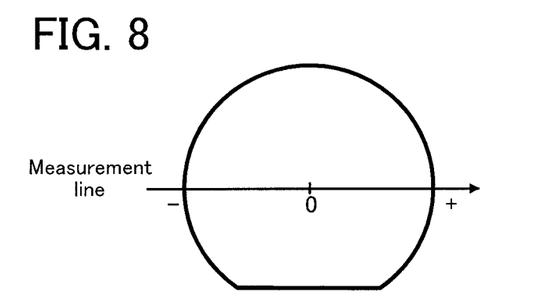
FIG. 8 is an explanatory view of a measurement line.
Figure 9A:
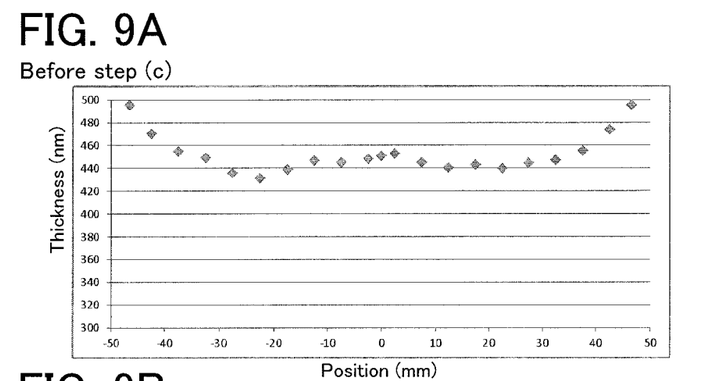
FIGS. 9A and 9B show graphs of thickness tendencies of the piezoelectric substrate before and after Step (c) in Example 1.
Figure 9B:
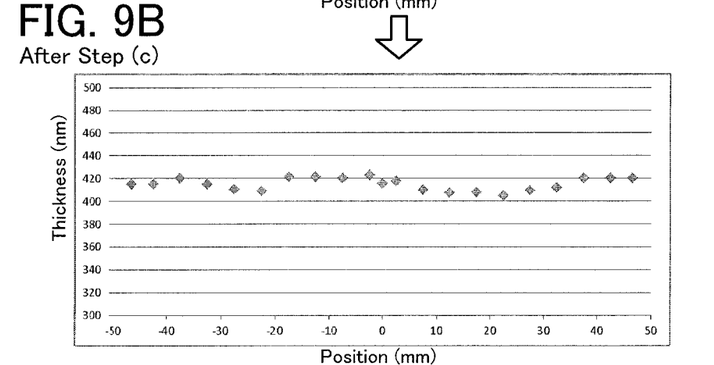

Before and after Step (c), the thickness of the piezoelectric substrate on a measurement line of the laminated substrate in FIG. 8 was measured. FIGS. 9A and 9B show thickness tendencies of the piezoelectric substrate before and after Step (c) in Example 1. FIG. 9A shows the thickness tendency before Step (c), and FIG. 9B shows the thickness tendency after Step (c). After Step (c), the thickness tendency of the piezoelectric substrate of Example 1 had three projecting portions in the cross section passing through the center of the substrate, as guessed from the interference fringes of FIGS. 7A and 7B.

Example 2

In Step (b), ion beam machining was performed so that the thickness of the outer peripheral portion and the thickness of the inner peripheral portion were equal to each other. In Step (c), the retention time of the polishing pad in the outer peripheral portion was shorter than in the inner peripheral portion. Otherwise, a composite substrate of Example 2 was produced similarly to Example 1, and an experiment was conducted similarly to Example 1.

The thickness of a piezoelectric substrate in a laminated substrate after Step (b) was measured. As a result, the center thickness was 450 nm and the difference between the largest thickness and the smallest thickness was 100 nm over the entire surface including the outer peripheral portion. When a rocking curve was measured with the X-ray diffractometer, the full width at a half maximum (FWHM) thereof was 80 arcsec, and this was equal to that of the bulk single crystal.

Figure 10:
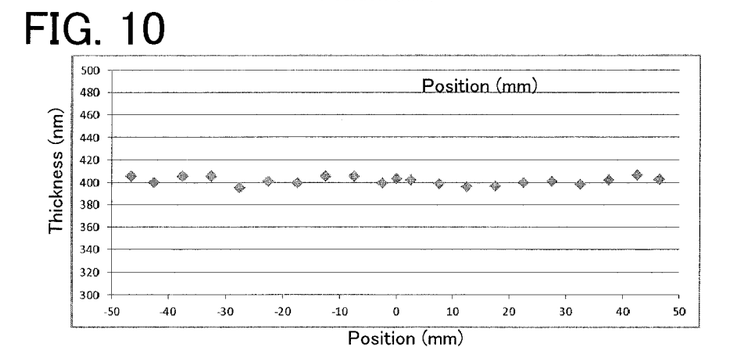
FIG. 10 shows a graph of thickness tendencies of the piezoelectric substrate after Step (c) in Example 2.

In the composite substrate of Example 2, similarly to the composite substrate of Example 1, a waveform having an amplitude of 5 to 20 nm in the thickness direction and a pitch of 3 to 5 mm in the width direction appeared in the thickness distribution of the piezoelectric substrate. The thickness tendency of the piezoelectric substrate after Step (c) (see FIG. 10) was as estimated from the shapes of intersections of interference fringes.

Example 3

In Step (c), the retention time in the outer peripheral portion was made equal to the retention time in the inner peripheral portion. Otherwise, a composite substrate of Example 3 was produced, similarly to Example 2, and an experiment was conducted similarly to Example 2.

Figure 11A:
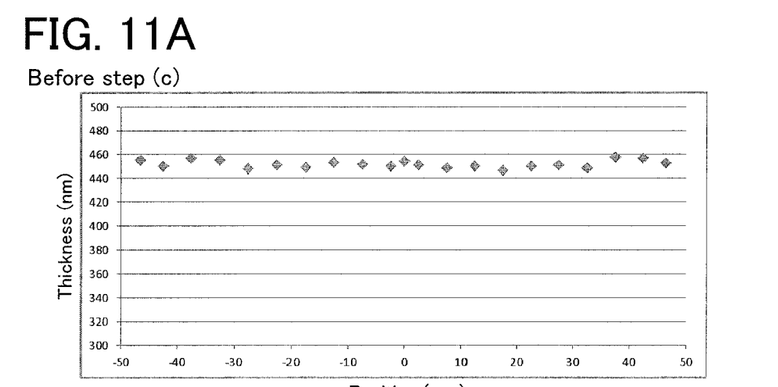
FIGS. 11A and 11B show graphs of thickness tendencies of the piezoelectric substrate before and after Step (c) in Example 3.

In the composite substrate of Example 3, similarly to the composite substrate of Example 2, a waveform having an amplitude of 5 to 20 nm in the thickness direction and a pitch of 3 to 5 mm in the width direction appeared in a thickness distribution of a piezoelectric substrate. The thickness tendency of the piezoelectric substrate after Step (c) (see FIG. 11B, FIG. 11A shows the thickness tendency of the piezoelectric substrate before Step (c)) was as estimated from the shapes of intersections of interference fringes.

Figure 11B:
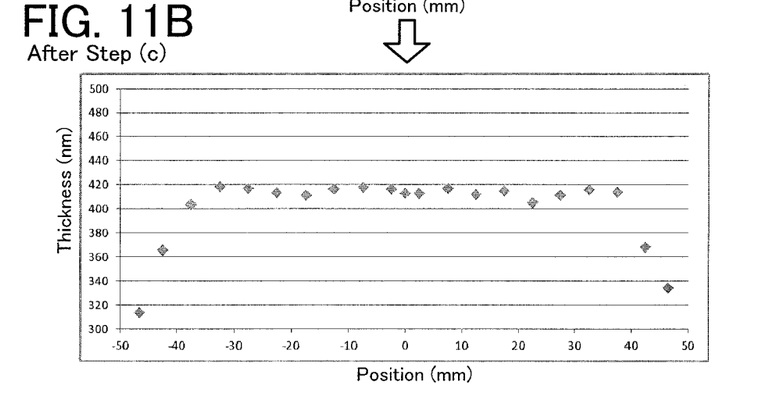

In Example 3, as shown in FIG. 11B, sagging occurred in the outer peripheral portion, and the thickness on the outermost periphery was reduced by 100 nm or more. In contrast, such great sagging did not occur in Example 1 and Example 2. This showed that the occurrence of sagging in Step (c) could be suppressed, for example, by performing machining in Step (b) so that the outer peripheral portion was thicker than the inner peripheral portion, as in Example 1 or making the retention time of the polishing pad in the outer peripheral portion shorter than in the inner peripheral portion in Step (c), as in Example 2.

Example 4

Step (b) was omitted. Further, in Step (c), the retention time of the polishing pad in the outer peripheral portion was made shorter than in the inner peripheral portion. Otherwise, a composite substrate of Example 4 was produced, similarly to Example 1, and an experiment was conducted similarly to Example 1.

The thickness of a piezoelectric substrate in a laminated substrate after Step (a) was measured. As a result, the center thickness was 1800 nm and the difference between the largest thickness and the smallest thickness was 80 nm over the entire surface including the outer peripheral portion.

Figure 12:
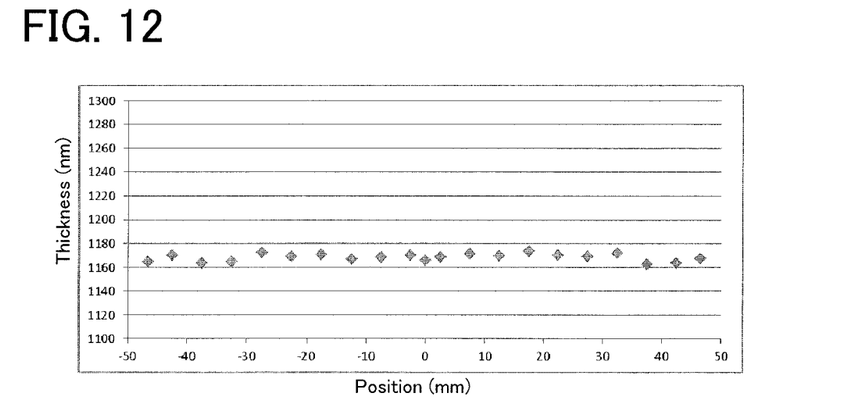
FIG. 12 shows graphs of thickness tendencies of the piezoelectric substrate before and after Step (c) in Example 4.

In the composite substrate of Example 4, similarly to the composite substrate of Example 1, a waveform having an amplitude of 5 to 20 nm in the thickness direction and a pitch of 3 to 5 mm in the width direction appeared in the thickness distribution of the piezoelectric substrate. The thickness tendency of the piezoelectric substrate after Step (c) (see FIG. 12) was as estimated from the shapes of intersections of interference fringes.

Comparative Example 1

A composite substrate of Comparative Example 1 was produced similarly to Example 1 except that Step (c) was omitted (a fringe-shaped thickness distribution was not provided), and an experiment was conducted similarly to Example 1.

Figure 13A:
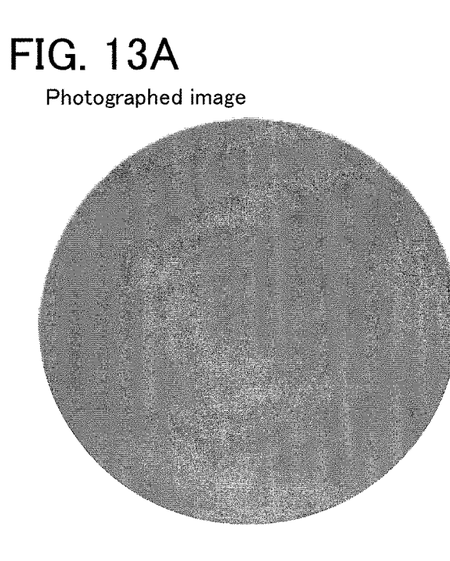
FIGS. 13A and 13B show interference fringes in the composite substrate of Comparative Example 1.
Figure 13B:
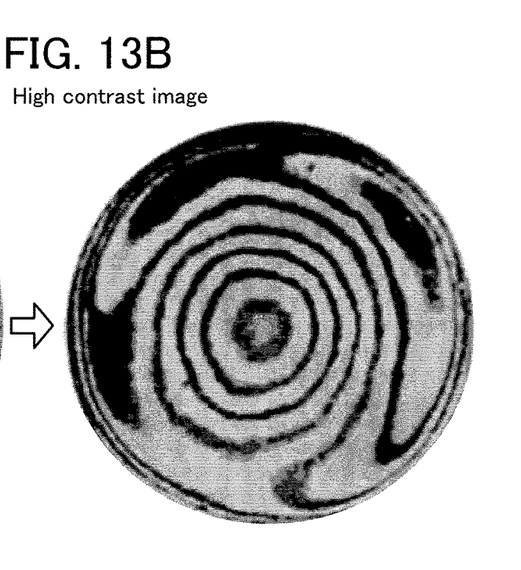

In the composite substrate of Comparative Example 1, interference fringes shown in FIGS. 13A and 13B were found. These interference fringes do not include intersections thereof. Hence, the thickness tendency of the piezoelectric substrate could not be estimated from the shapes of the intersections of the interference fringes.

The present application claims priority from Japanese Patent Application No. 2015-181763, filed on Sep. 15, 2015, the entire contents of which are incorporated herein by reference.

What is claimed is:

1. A composite substrate comprising:
   a support substrate having a diameter of 2 inches or more; and
   a piezoelectric substrate having a thickness of 20 µm or less and bonded to the support substrate to transmit light,
   wherein the piezoelectric substrate has a thickness distribution shaped like a fringe, and
   wherein a waveform having an amplitude of 5 nm or more and 100 nm or less in a thickness direction and a pitch within a range of 0.5 to 20 mm in a width direction appears in the thickness distribution of the piezoelectric substrate in a cross section of the composite substrate taken along a line orthogonal to the fringe, and the pitch of the waveform correlates with a width of the fringe.

2. The composite substrate according to claim 1, wherein the fringe includes parallel fringes in the piezoelectric substrate.

3. The composite substrate according to claim 1, wherein the fringe includes spiral fringes or concentric fringes in the piezoelectric substrate.

4. The composite substrate according to claim 1, wherein a difference between a largest thickness and a smallest thickness of the piezoelectric substrate is 100 nm or less over an entire surface.

5. The composite substrate according to claim 1, wherein the piezoelectric substrate is bonded to the support substrate by direct bonding.

6. A thickness-tendency estimating method for a piezoelectric substrate that estimates a thickness tendency of a piezoelectric substrate in the composite substrate according to claim 1, the method comprising:
   irradiating the piezoelectric substrate of the composite substrate with monochromatic light;
   determining whether or not a second interference fringe different from a first interference fringe representing the fringe-shaped thickness distribution appears; and
   determining the thickness tendency of the piezoelectric substrate from a shape of an intersection of a bright line of the first interference fringe and a dark line of the second interference fringe when it is determined that the second interference fringe appears, on a basis that, when the bright line of the first interference fringe at the intersection is recessed, a thickness increases in a recessing direction, and when the bright line of the first interference fringe at the intersection projects, the thickness increases in a projecting direction, and determining that the tendency is not found in the thickness of the piezoelectric substrate when it is determined that the second interference fringe does not appear.

* * * * *